(12) United States Patent
Sugawara et al.

(10) Patent No.: US 7,148,518 B2
(45) Date of Patent: Dec. 12, 2006

(54) GROUP-III NITRIDE SEMICONDUCTOR STACK, METHOD OF MANUFACTURING THE SAME, AND GROUP-III NITRIDE SEMICONDUCTOR DEVICE

(75) Inventors: Hideto Sugawara, Kanagawa-ken (JP); Tsunenori Hiratsuka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 10/806,681

(22) Filed: Mar. 23, 2004

(65) Prior Publication Data

US 2004/0206966 A1    Oct. 21, 2004

(30) Foreign Application Priority Data

Mar. 24, 2003 (JP) ............................. P2003-079387

(51) Int. Cl.
*H01L 33/00* (2006.01)
(52) U.S. Cl. ................. 257/97; 257/191; 257/E33.008; 257/E33.026; 257/E33.048
(58) Field of Classification Search ...................... None
See application file for complete search history.

(56) References Cited

U.S. PATENT DOCUMENTS 5,874,747 A * 2/1999 Redwing et al. ............. 257/77
6,072,189 A * 6/2000 Duggan ....................... 257/14

OTHER PUBLICATIONS

Iwaya, et al., "Reduction of Etch Pit Density in Organometallic Vapor Phase Expitaxy-Grown GaN on Sapphire by Insertion of a Low-Temperature-Deposited Buffer Layer between High-Temperature-Grown GaN" Jpn.J. Appl. Phys. vol. 37 (1998) pp. 316-318.
Amano, et al., "Stress and Defect Control in GaN Using Low Temperature Interlayers" Jpn.J. Appl. Phys. vol. 37 (1998) pp. 1540-1542).

* cited by examiner

*Primary Examiner*—Asok Kumar Sarkar
(74) *Attorney, Agent, or Firm*—Hogan & Hartson LLP (57) ABSTRACT

A group-III nitride semiconductor stack comprises a single-crystal substrate, a first group-III nitride layer formed on a principal surface of the single-crystal substrate, a graded low-temperature deposited layer formed on the group-III nitride layer and made of nitride in which group-III element composition is continuously changed, and a second group-III nitride layer formed on the graded low-temperature deposited layer.

19 Claims, 8 Drawing Sheets

GROUP-III NITRIDE SEMICONDUCTOR STACK, METHOD OF MANUFACTURING THE SAME, AND GROUP-III NITRIDE SEMICONDUCTOR DEVICE

CROSS-REFERENCE TO RELATED APPLICATIONS

This application is based upon and claims the benefit of priority from the prior Japanese Patent Application No. 2003-79387, filed Mar. 24th 2003, the entire contents of which are incorporated herein by reference.

FIELD OF THE INVENTION

The present invention relates to a group-III nitride semiconductor stack having a reduced crystal defect density, a method of manufacturing the same, and a group-III nitride semiconductor device.

BACKGROUND OF THE INVENTION

Semiconductor elements using group-III nitride semiconductors have light-emitting and light-receiving capabilities for light in the range from visible to ultraviolet. Part of the semiconductor elements have been in practical use.

Since the optical transitions of group-III nitride semiconductors are direct transitions, high-efficiency radiative recombination can occur. The transition energies thereof widely range from 2 to 6.2 eV. Group-III nitride semiconductors are being developed as high-efficiency light-emitting element material for semiconductor lasers (LDs) and high-intensity visible light-emitting elements (LEDs). Gallium nitride (GaN) semiconductors can emit light at a wavelength in the ultraviolet region, as group III-V compound semiconductors. GaN semiconductors are also considered to be capable of replacing existing ultraviolet light sources.

Group-III nitride semiconductors are represented by the general formula $In_{1-x-y}Al_xGa_yN$ ($0 \leq x \leq 1$, $0 \leq y \leq 1$, $0 \leq x+y \leq 1$). This includes InN, AlN, GaN, $In_{1-y}Ga_yN$, $Al_xGa_{1-x}N$, and the like. In the case where only constituent elements are shown while composition ratios (x, y, and the like) are being omitted, the series constituted by the constituent elements is represented. For example, InGaN represents the series generally described as $In_{1-y}Ga_yN$.

$In_{1-y}Ga_yN$ is one of group-III nitride semiconductors. The band gap energy of $In_{1-y}Ga_yN$ can be changed from 3.4 eV for GaN to 2 eV for InN by changing the In composition 1-y. Accordingly, InGaN can be used for an active layer of a visible LED.

Currently, an LED using an InGaN mixed crystal as a light-emitting layer has been realized. Also in an LD, laser oscillation has been realized in current injection. However, the efficiency of an LED using a crystal with a small In composition 1-y (approximately equal to or less than 0.05) as an active layer is hard to increase because of the difference in light emitting mechanism.

On the other hand, the band gap energy of an $Al_xGa_{1-x}N$ semiconductor can be changed between 3.4 eV and 6.2 eV by changing the Al composition x. Although $Al_xGa_{1-x}N$ semiconductors have potential as ultraviolet light-emitting materials, it is hard to obtain high-efficiency light emission. This is because $Al_xGa_{1-x}N$ semiconductors do not have a specific emission mechanism related to In unlike InGaN semiconductors.

Group-III nitride semiconductors, which are materials emitting light in the range from visible to ultraviolet, are greatly affected by many crystal defects existing in crystals. Injected carriers cause non-radiative recombination in the crystal defects. This results in the decrease in emission efficiency.

For the crystal growth of group-III nitride semiconductors, metal-organic chemical vapor deposition method (also referred to as MOCVD or MOVPE) and molecular beam epitaxy method (MBE) are generally used.

Hereinafter, a known typical method of growing a group-III nitride semiconductor using MOCVD will be described.

An ideal substrate is a favorable one for epitaxial growth and has a small lattice constant difference and a small thermal expansion coefficient difference from the group-III nitride semiconductor. However, such a substrate material is hard to obtain. Accordingly, single-crystal sapphire is mostly used for convenience in terms of stability in a crystal growth atmosphere, a price, and the like.

This sapphire substrate is mounted in a reactor. The temperature of the sapphire substrate is kept at a low temperature between 400° C. and 600° C. In this state, trimethylgallium (TMG), which is organic metal, and ammonia (NH3) are supplied on the sapphire substrate using hydrogen as carrier gas, thus growing a GaN buffer layer. Thereafter, a crystal layer, e.g., a single-crystal GaN layer, necessary for the structure of an element, such as an LED, is grown. That is, the temperature of the sapphire substrate is raised to 1000 to 1100° C., and ammonia and TMG are supplied on the GaN buffer layer, thus growing the single-crystal GaN layer. In the case where a single crystal having Al as a constituent element, e.g., a single crystal of AlGaN, is grown, trimethylaluminum (TMA) is further added to the raw material to grow this single crystal.

However, this method of growing a group-III nitride semiconductor has a problem that many crystal defects exist in the GaN crystal grown on the sapphire substrate.

One cause thereof is strain due to the lattice constant difference. Another cause thereof is strain due to the thermal expansion difference between the sapphire substrate and the grown layer in the cooling process from the growth temperature to room temperature. These crystal defects need to be reduced in order to manufacture a light-emitting element having high emission efficiency. Particularly in an element emitting ultraviolet light, reducing crystal defects is an important subject.

A growth method in which a patterning mask and lateral growth (in a direction perpendicular to the stacking direction) are combined has been mostly used. This is for reducing crystal defects, i.e., for preventing the propagation of dislocation from a substrate side to a semiconductor layer grown on the substrate.

This method requires a mask formation process and a total of two MOCVD crystal growth processes before and after the foregoing process. Here, one crystal growth process means a series of operations stating with attaching a substrate to an MOCVD system and ending with taking out the substrate from the MOCVD system to the outside after growing a crystal. As a result, there has been a problem that the elongation of the growth process time cannot be avoided and results in the increase in the cost of a light-emitting element.

Figure 1:
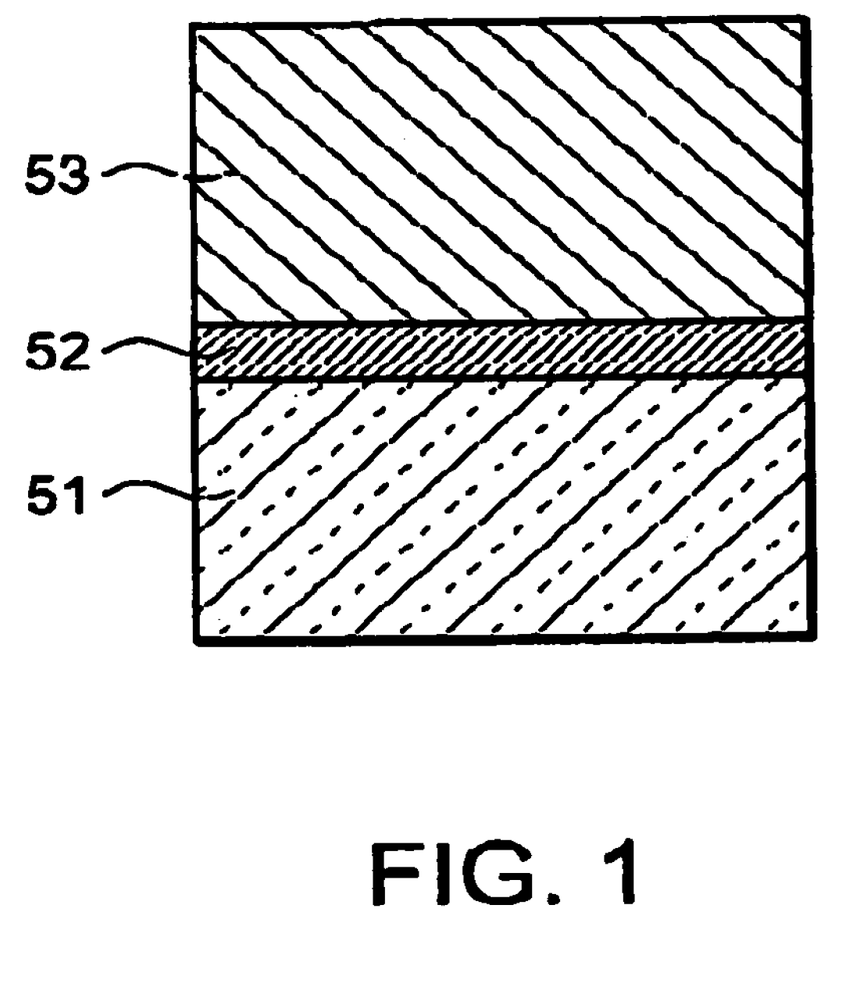
FIG. 1 is a diagram showing a known group-III nitride semiconductor stack.

As an improvement measure for this, there is a technology for reducing crystal defects in one growth process. As shown in FIG. 1, buffer layer 52 is grown on sapphire substrate 51 at a low temperature between 400° C. and 500° C. An undoped GaN layer 53 is epitaxially grown on the buffer layer at a temperature between 1000° C. and 1100° C. However, in this growth method, crystal defects have not been sufficiently reduced.

In order to solve such a problem, there is a technology which reduces crystal defects in one growth process. This is a method in which the propagation of dislocation to an upper layer is prevented by a low-temperature deposited layer (for example, refer to "Motoaki Iwaya, et al., Jpn. J. Appl. Phys. Vol. 37 (1998) pp. L316–L318," hereinafter referred to as "Literature 1").

Figure 2A:
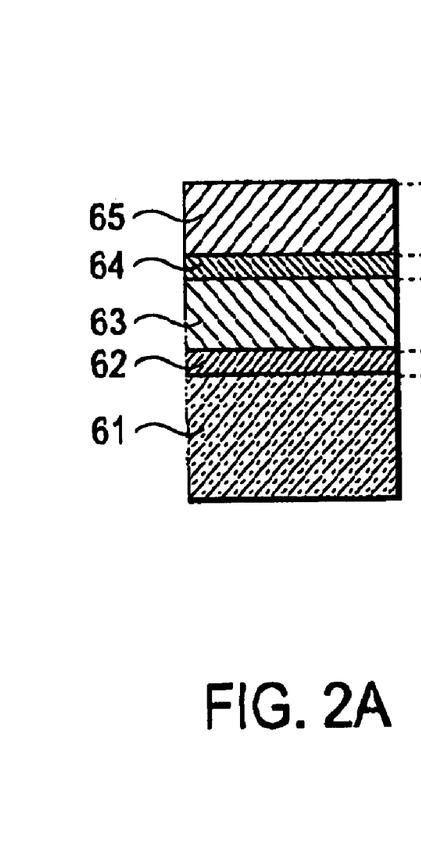
FIGS. 2A and 2B are a diagram of a group-III nitride semiconductor stack obtained by improving the known group-III nitride semiconductor stack and a chart of a growth process for realizing the same.

The semiconductor stack disclosed in this literature 1 is shown in FIG. 2A. Buffer layer 62 (a first low-temperature deposited layer) made of AlN, is grown on sapphire substrate 61 at low temperature (400° C.). On buffer layer 62, undoped GaN layer 63 is grown at high temperature (1050° C.). On undoped GaN layer 63, second low-temperature deposited layer 64 made of AlN is grown at low temperature (400° C.). On second low-temperature deposited layer 64, undoped GaN layer 65 is grown at high temperature (1050° C.). This stack can be regarded as a structure in which second low-temperature deposited layer 64 is interposed between two undoped GaN layers 63 and 65 grown at high temperature.

This literature 1 has reported that first and second low-temperature deposited layers 62 and 64 have the effect of reducing crystal defects of GaN layer 63 regardless of whether first and second low-temperature deposited layers 62 and 64 are made of AlN or GaN. Newly providing second low-temperature deposited layer 64 is considered important to the reduction of crystal defects, rather than whether the composition is Al or Ga.

SUMMARY OF THE INVENTION

A group-III nitride semiconductor stack according to an embodiment of the present invention comprises a single-crystal substrate, a first group-III nitride layer formed on a principal surface of the single-crystal substrate, a graded low-temperature deposited layer formed on the group-III nitride layer and made of nitride in which group-III element composition is continuously changed, and a second group-III nitride layer formed on the graded low-temperature deposited layer.

A method of manufacturing a group-III nitride semiconductor stack according to another embodiment of the present invention comprises forming a first group-III nitride layer on a principal surface of a single-crystal substrate, forming a graded low-temperature deposited layer in which group-III element composition is continuously changed, on the first group-III nitride layer without growth interruption, and forming a second group-III nitride layer on the graded low-temperature deposited layer without growth interruption.

A group-III nitride semiconductor device according to another embodiment of the present invention comprises a single-crystal substrate, an undoped group-III nitride layer formed on a principal surface of the single-crystal substrate, a graded low-temperature deposited layer which is formed on the undoped group-III nitride layer and in which group-III element composition is continuously changed, an n-type group-III nitride contact/cladding layer formed on the graded low-temperature deposited layer, a group-III nitride MQW active layer formed on the n-type group-III nitride contact/cladding layer, a p-type group-III nitride cladding layer formed on the group-III nitride MQW active layer, and a p-type group-III nitride contact layer formed on the p-type group-III nitride cladding layer.

DETAILED DESCRIPTION OF THE INVENTION

Figure 2B:
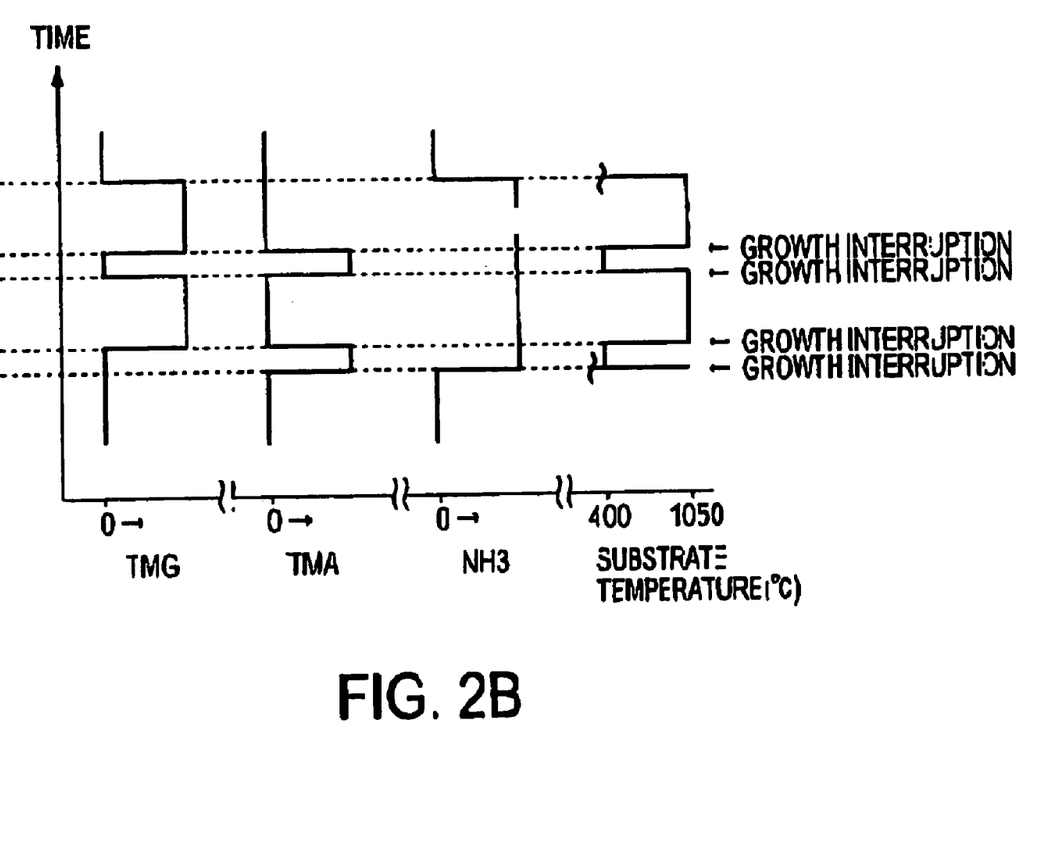

Before embodiments will be described, the stack of FIG. 2A and a method of stacking the same will be further described in detail. In FIG. 2B, the states of supply of raw material gases and a substrate temperature are shown so as to correspond to the stack of FIG. 2A. In FIG. 2B, the portions indicated by "growth interruption" mean that there is a time interval between the completion of growth of a lower layer and the start of growth of a layer thereon.

The growth of each layer on the principal surface of the sapphire substrate of FIG. 2A is accompanied by growth interruption before. On buffer layer 62 formed on sapphire substrate 61, undoped GAN layer 63 is grown at a substrate temperature of 1050° C. The supply of Ga raw material is once stopped (growth interruption). The substrate temperature is lowered to 400° C., which is the growth temperature for second low-temperature deposited layer 64, and stabilized. Thereafter, Ga raw material (Al raw material in the case of growing AlN) is supplied again to grow low-temperature deposited layer 64.

After low-temperature deposited layer 64 has been grown, the supply of Ga raw material, which is growth raw material, is once stopped (growth interruption). The substrate temperature is raised to 1050° C., which is the growth temperature for an undoped GaN layer, and stabilized. Ga raw material is supplied again to grow undoped GaN layer 65.

In this method, this series of crystal growth processes include temperature-lowering time in which growth is interrupted. At this time, on the surface where undoped GaN layer 63 is exposed, the transport of Ga of group III and dropouts of N of group V occur to cause the alteration of the surface.

Moreover, on this altered undoped GaN layer 63, second low-temperature deposited layer 64 is grown. Thereafter, if growth is interrupted again and the substrate temperature is raised, the alteration of the surface, such as N dropouts from second low-temperature deposited layer 64 and Ga transport, occurs more significantly. It is difficult to grow second low-temperature deposited layer 64 so as to have an even film thickness and be flat.

Since dropouts of N, Ga transport, and the like accidentally occur, there is little repeatability for each lot. Therefore, a high-reliable undoped GaN layer having reduced crystal defects cannot be formed.

Embodiments of the present invention make it possible to planarize a surface, control a film thickness, improve repeatability, and reduce crystal defects in one crystal growth process.

Hereinafter, the embodiments of the present invention will be described with reference to the drawings.

FIRST EMBODIMENT

A group-III nitride semiconductor stack according to a first embodiment of the present invention and a method of manufacturing the same will be described with reference to FIGS. 3A to 5.

Figure 3A:
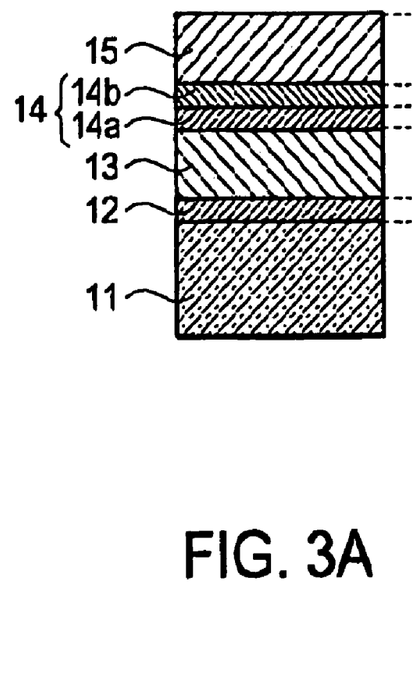
FIGS. 3A and 3B are a diagram of a group-III nitride semiconductor stack according to a first embodiment of the present invention and a chart of a growth process for realizing the same.
Figure 3B:
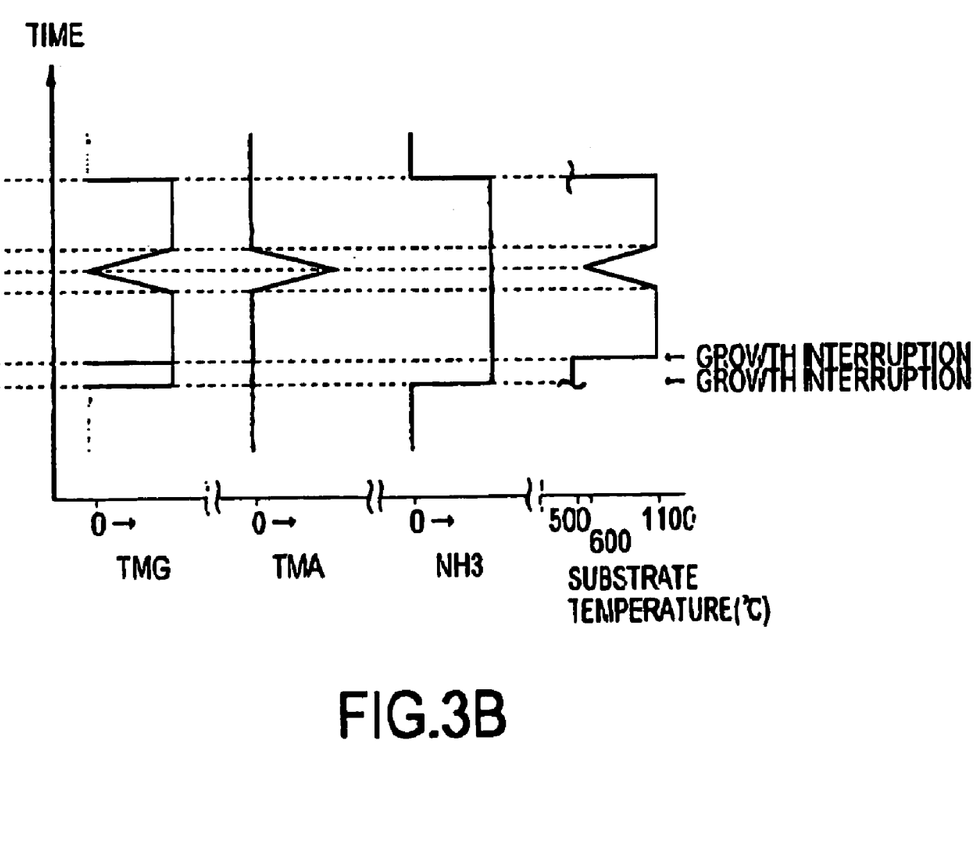

FIG. 3A is a cross-sectional view schematically showing the group-III nitride semiconductor stack of the first embodiment. FIG. 3B is a chart of a growth process for realizing the foregoing. The first to third charts from the left in FIG. 3B show the timing of supply of respective raw material gases, and the first chart from the right shows a substrate temperature. In FIG. 3B, the vertical axis indicates a grown film thickness corresponding to the stack of FIG. 3A, i.e., indicates the passage of growth time excluding growth interruption. The markings 0 of this horizontal axis of FIG. 3B indicate the state where the supply of raw material is stopped, and the right side of 0 indicates the states of supply of raw material gases. Although the amount of supply increases from left to right on the horizontal axis, the increase and decrease in the amount of supply corresponding to the substrate temperature or the growth rate are not shown.

In the present embodiment, an MOCVD system is used for the crystal growth of a group-III nitride semiconductor. A sapphire substrate is used as a single-crystal substrate. Trimethylgallium (TMG) as Ga raw material, trimethylaluminum (TMA) as Al raw material, and ammonia (NH3) as N raw material are used.

In the manufacture of the stack of FIG. 3A, first, sapphire substrate 11 is mounted in the MOCVD system. TMG and NH3 are supplied in the MOCVD system in the state where the substrate temperature is kept at 500° C. For example, TMG is supplied at a flow rate of 40 □mol/min, and NH3 is supplied at a flow rate of 0.4 □mol/min. Buffer layer 12 of GaN which is group-III nitride is grown on sapphire substrate 11.

The temperature of sapphire substrate 11 is raised to 1100° C. while the inside of the MOCVD system is being kept in the state of an ammonia atmosphere. Until the temperature of sapphire substrate 11 reaches 1100° C., growth is interrupted. The supply of TMG allows undoped GaN layer 13, which is first group-III nitride, to be grown on buffer layer 12. For example, TMG is supplied at a flow rate of 150 □mol/min.

The temperature of sapphire substrate 11 is gradually and continuously lowered from 1100° C. toward 600° C. under control. At the same time, the supply of TMA and the reduction of the supply amount of TMG are simultaneously started. The flow rate of TMG is gradually reduced at a constant rate, and the flow rate of TMA is gradually increased so as to match the reduction of TMG. For example, TMA is ultimately supplied at a flow rate of 40 □mol/min. Thus, graded low-temperature deposited layer 14a is grown on undoped GaN layer 13. In graded low-temperature deposited layer 14a, the Al composition ratio x of AlxGa1−xN is gradually changed from 0 (when the substrate temperature is 1100° C.) to 1 (when the substrate temperature is 600° C.).

After the temperature of sapphire substrate 11 has reached 600° C., the temperature is continuously raised toward 1100° C. under control again. At the same time, the flow rate of TMG is gradually increased at a constant rate in contrast, and the flow rate of TMA is gradually reduced in proportion to the increase of TMG. For example, TMG is ultimately supplied at a flow rate of 150 □mol/min. The Al composition ratio x is gradually changed from a predetermined supply amount to 0, and the Ga composition ratio 1−x is gradually changed from 0 to a predetermined supply amount. Thus, graded low-temperature deposited layer 14b in which the Al composition ratio x of AlxGa1−xN is gradually changed from 1 (600° C.) to 0 (1100° C.) is grown.

For example, in the case where the increase and decrease of the composition ratio x are changed along almost the same line as shown in FIG. 3B, the composition ratio of Al is maximum at the center portion of graded low-temperature deposited layer 14.

Thereafter, undoped GaN layer 15, which is second group-III nitride, is grown at the sapphire substrate temperature raised to 1100° C. without stopping the supply of TMG. Thus, the stack of FIG. 3A is completed.

In the above embodiment, to cite examples of the film thicknesses of the respective layers, buffer layer 12 having a film thickness of 30 nm, undoped GaN layer 13 having a film thickness of 1 □m, graded low-temperature deposited layers 14a and 14b having a total film thickness of 50 nm, and undoped GaN layer 15 having a film thickness of 1 □m are formed.

The effect of reducing a crystal defect density in the stack of the present embodiment will be confirmed. A known group-III nitride semiconductor stack having no graded low-temperature deposited layer shown in FIG. 1 is manufactured, and the comparison with this is performed. The crystal defect density is evaluated by immersing the stack in KOH heated and melted at 360° C. for 30 seconds to etch the crystal surface. A method of observing etch pits (defects) due to this etching using an electron microscope to evaluate the density thereof is adopted.

The observation result was $5\times10^7$ (pits/cm$^2$) for the surface of the undoped GaN layer in the known stack of FIG. 1. On the other hand, the observation result was $5\times10^6$ (pits/cm$^2$) for the surface of the undoped GaN layer of the present embodiment. The etch-pit density was confirmed to be reduced by approximately an order of magnitude.

This result confirmed that the crystal defect density of the surface of the undoped GaN layer is reduced in the stack of the present embodiment. Moreover, repeated similar experiments confirmed the repeatability thereof.

Figure 4:
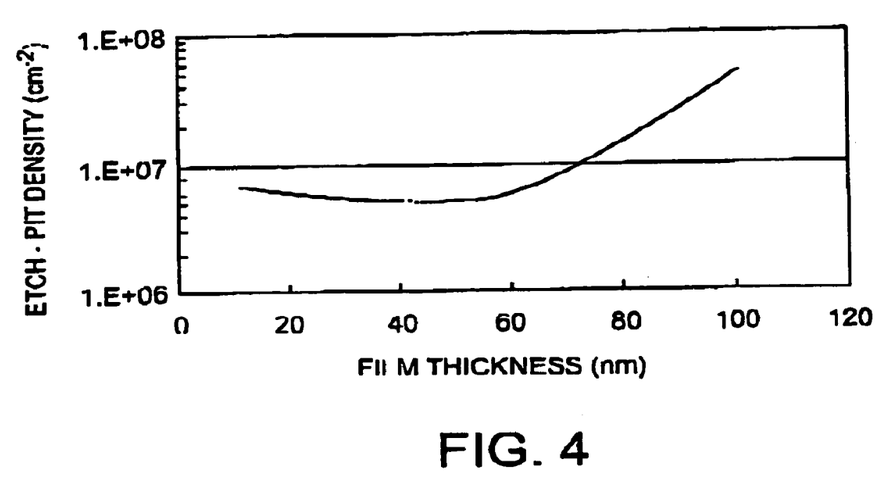
FIG. 4 is a graph showing the relationship between the film thickness and etch-pit density of a graded low-temperature deposited layer according to the first embodiment of the present invention.
Figure 5:
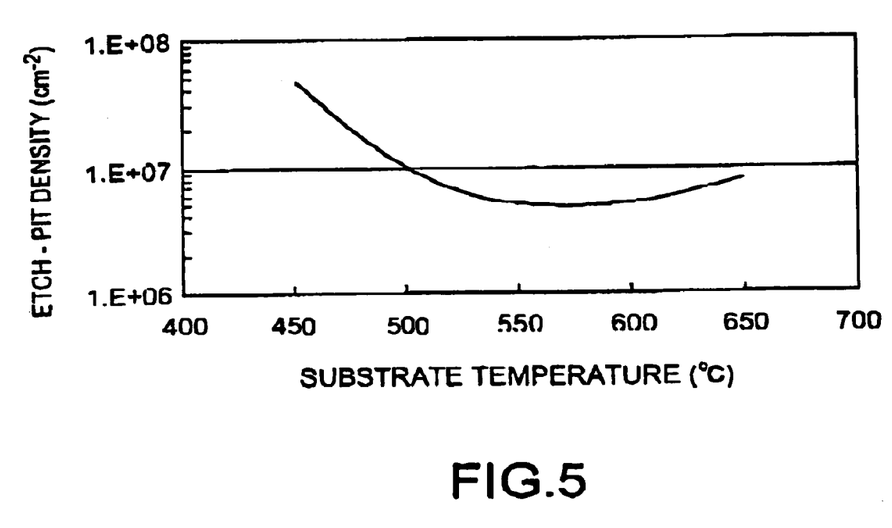
FIG. 5 is a graph showing the relationship between the growth substrate temperature and etch-pit density of the graded low-temperature deposited layer according to the first embodiment of the present invention.

The relationships with the etch-pit density when the film thickness of graded low-temperature deposited layer 14 and the substrate temperature are individually changed in the stack of the present embodiment are shown in FIGS. 4 and 5, respectively.

FIG. 4 is a graph showing the relationship between the film thickness of the graded low-temperature deposited layer and the etch-pit density. The film thickness of graded low-temperature deposited layer 14 is shown on the horizontal axis, and the change in the etch-pit density is shown on the vertical axis. The film thickness means the film thickness grown since the supply of TMA is started until the supply thereof is stopped in the growth process chart of FIG. 3B.

As apparent from FIG. 4, the etch-pit density remarkably increases as the film thickness increases. Graded low-temperature deposited layer 14 is preferably formed so as to have a film thickness within the range of 10 nm to 70 nm.

FIG. 5 is a graph showing the relationship between the substrate temperature of the graded low-temperature deposited layer and the etch-pit density. The substrate temperature of the graded low-temperature deposited layer is shown on the horizontal axis, and the etch-pit density is shown on the vertical axis. The substrate temperature means the temperature which is the temperature at the lowest point of temperature lowering and which corresponds to 600° C. in the growth process chart of FIG. 3B.

As apparent from FIG. 5, the etch-pit density remarkably increases when the substrate temperature becomes lower than 550° C. The lowest substrate temperature (lowest growth temperature) is preferably set within the range of 500° C. to 650° C.

According to this first embodiment, graded low-temperature deposited layer 14 is an AlGaN layer in which the Al composition ratio gradually increases from the sapphire substrate 11 side along the growth direction and then gradually decreases. The growth thereof is performed in a temperature lowering state in which the substrate temperature gradually decreases or in a temperature raising state in which the substrate temperature gradually increases.

In other words, in the stack of the present embodiment, graded low-temperature deposited layer 14 and undoped GaN layers 13 and 15 on and under graded low-temperature deposited layer 14 are formed by continuous growth without growth interruption. Since there is no growth interruption, the alteration of the exposed surface of dropouts of N, Ga transport and the like, does not occur particularly at high temperature and a flat layer can be formed. The surface of the low-temperature deposited layer formed thereon becomes flat and the film thickness thereof is controlled. Moreover, since accidental dropouts of N, Ga transport, and the like are suppressed, the reduction of crystal defects in the undoped GaN layer thereon can be realized with high repeatability.

As a modification of the present embodiment, the graded low-temperature deposited layer may be formed only when the temperature is lowered from 1100° C. to 600° C. To make an explanation with reference to FIG. 3A, this corresponds to the case where only graded low-temperature deposited layer 14a is formed but graded low-temperature deposited layer 14b is not formed.

In this case, when the temperature is raised from 600° C. to 1100° C. for the growth of the next undoped GaN layer 15, growth interruption occurs. Accordingly, the etch-pit density is almost doubled compared to the case where continuous growth is performed in both temperature lowering and temperature raising of the aforementioned embodiment. Nevertheless, the etch-pit density of undoped GaN layer 15 is improved compared to the stack based on the method disclosed in Literature 1.

Although the detailed mechanism is uncertain, it can be inferred that the growth interruption when the temperature is raised from 600° C. to 1100° C. have a low degree of causing the alteration of the surface of the graded low-temperature deposited layer, compared to the growth interruption when the temperature is lowered from 1100° C. to 600° C. However, in order to minimize the crystal defect density, it is preferred that the graded low-temperature deposited layer is continuously grown in both temperature lowering and temperature raising.

SECOND EMBODIMENT

A group-III nitride semiconductor stack according to a second embodiment of the present invention and a method of manufacturing the same will be described with reference to FIGS. 6 to 10. The present embodiment is an example of a stack applicable to a group-III nitride semiconductor LED.

Figure 6:
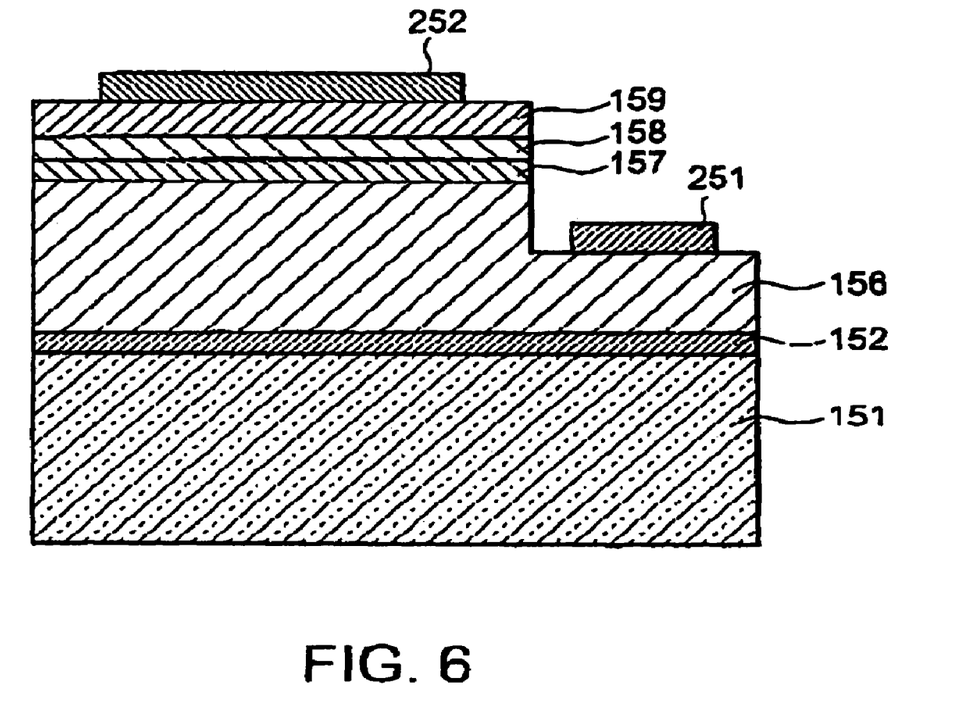
FIG. 6 is a structure diagram schematically showing a typical group-III nitride semiconductor LED.
Figure 7:
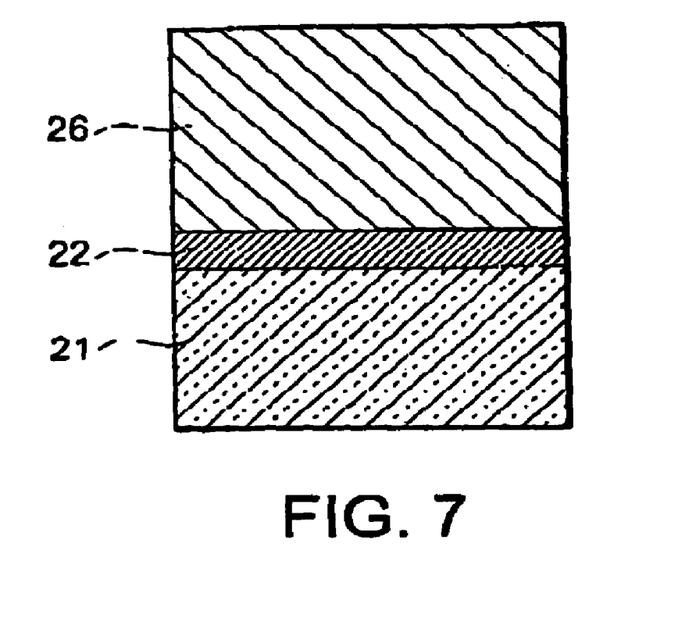
FIG. 7 is a diagram showing a general stack as an underlying layer in the typical group-III nitride semiconductor LED.
Figure 8:
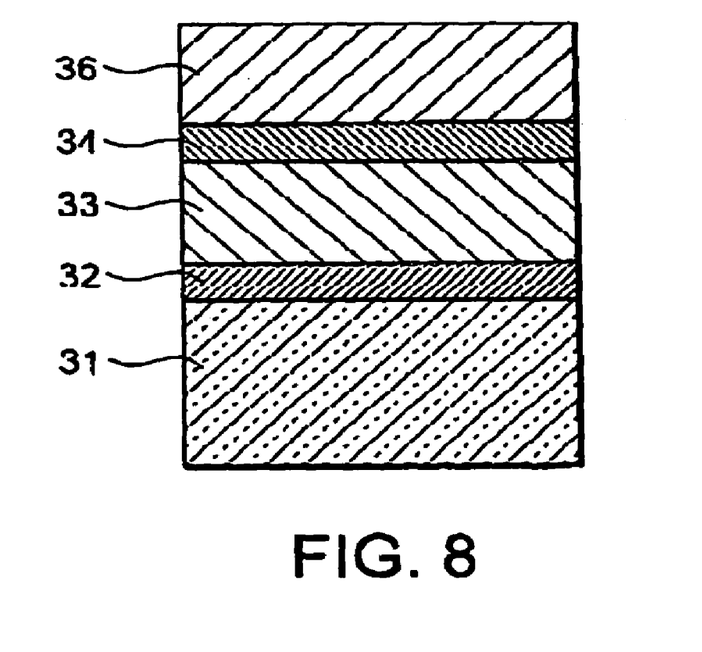
FIG. 8 is a diagram showing a stack as an underlying layer in a group-III nitride semiconductor LED according to a second embodiment of the present invention.
Figure 9:
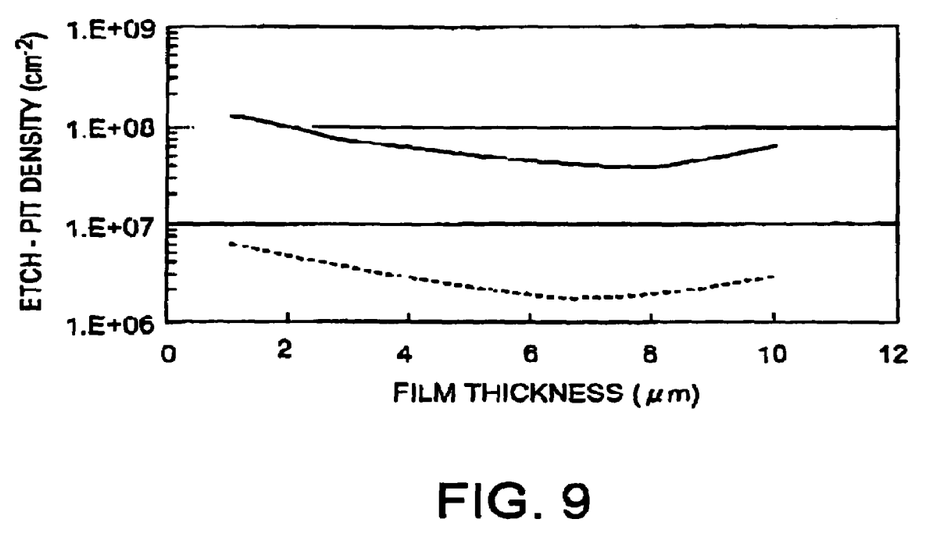
FIG. 9 is a graph for comparing the etch-pit density of the stack according to the second embodiment of the present invention and that of the known typical stack.
Figure 10:
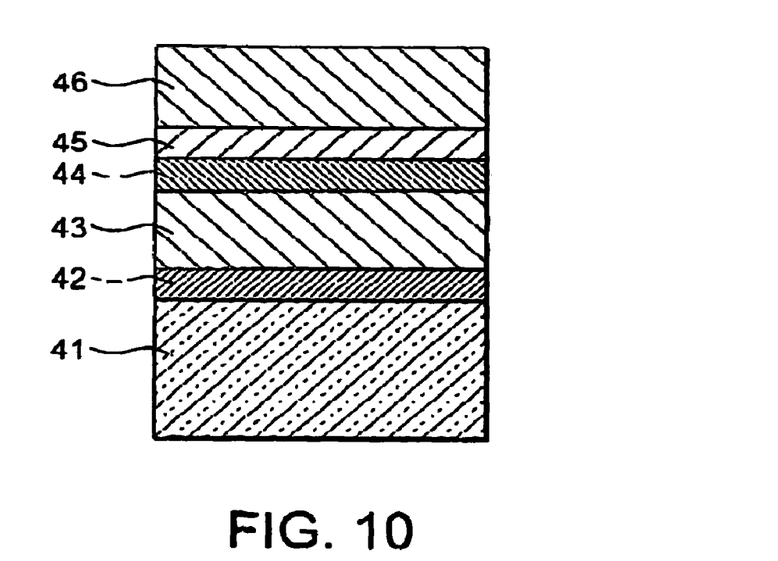
FIG. 10 is a diagram showing a stack in which the undoped GaN layer is interposed between a graded low-temperature deposited layer and a Si-doped GaN layer.

FIG. 6 shows a group-III nitride semiconductor LED normally adopted. FIG. 7 shows a stack as an underlying layer for forming light-emitting active layer 157 as an optical element in the LED structure of FIG. 6. FIG. 8 shows a stack of an underlying layer according to the present embodiment. FIG. 9 is a graph showing the relationship between the film thickness of an undoped GaN layer, which is an intermediate layer of the stack, and the surface etch-pit density. The solid line in FIG. 9 represents the stack having no graded low-temperature deposited layer shown in FIG. 7. The dashed line in FIG. 9 represents the stack having a graded low-temperature deposited layer of the present embodiment shown in FIG. 8. FIG. 10 is a diagram showing a stack in which the undoped GaN layer is interposed between the graded low-temperature deposited layer and a Si-doped GaN layer.

As shown in FIG. 6, buffer layer 152, n-GaN contact/cladding layer 156, InGaN multiple quantum well (MQW) active layer 157, p-AlGaN cladding layer 158, and p-GaN contact layer 159 are stacked and formed in this order on sapphire substrate 151. On n-GaN contact layer 156, n-side electrode 251 is formed. On p-GaN contact layer 159, p-side electrode 252 is formed.

In order to improve light-emitting characteristics in this group-III nitride semiconductor LED, crystal defects in n-GaN contact/cladding layer 156 of the stack needs to be reduced. This stack is the underlying layer of InGaN MQW active layer 157.

The present inventors first manufactured the stack shown in FIG. 7. This stack is obtained by forming buffer layer 22 on sapphire substrate 21 and Si-doped n-GaN layer 26 thereon to be used as an n-GaN contact/cladding layer. This is the stack shown in FIG. 1 in which undoped GaN layer 53 on buffer layer 52 is replaced by Si-doped n-GaN layer 26. The carrier concentration of this Si-doped n-GaN layer 26 is set to $3 \times 10^{18}$(cm$^{-3}$), and the film thickness thereof is set to 2 □m.

When the surface of Si-doped n-GaN layer 26 of this stack shown in FIG. 7 was observed using an electron microscope or the like, flatness is relatively good, but roughness indicating alteration was slightly observed.

The etch-pit density of the surface of Si-doped n-GaN layer 26 of this stack was evaluated by the same method as described previously.

As a result, the etch-pit density of Si-doped n-GaN layer 26 was $1 \times 10^8$ (pits/cm$^2$). This is twice that of the undoped GaN layer under which the graded low-temperature deposited layer described in the first embodiment is not formed. This indicates that the etch-pit density is increased by doping with Si. This reveals that the improvement of emission efficiency is more important in using Si-doped n-GaN layer 26 as n-GaN contact/cladding layer 156 in an LED, which is an actual device. Emission efficiency can be improved by reducing crystal defects in this Si-doped n-GaN layer 26.

Accordingly, in the stack of the present embodiment, as shown in FIG. 8, buffer layer 32 deposited at low temperature, undoped GaN layer 33, graded low-temperature deposited layer 34, and Si-doped n-GaN layer 36 as an n-GaN contact/cladding layer are sequentially grown in this order on sapphire substrate 31.

In the growth process for each layer, the supply of raw material and the lowering and raising of the substrate temperature are performed according to the growth process chart shown in FIG. 3. Subsequently, without growth interruption, Si-doped n-GaN layer 36 is grown. The growth of this Si-doped n-GaN layer 36 is performed at a substrate temperature of 1100° C. by supplying SiH4 gas for Si doping.

When the surface of the stack of the present embodiment was observed using an electron microscope or the like, the flatness of Si-doped n-GaN layer 36 was good, and roughness and the like indicating alteration were not observed.

The etch-pit density of the surface of Si-doped GaN layer 36 in this stack was evaluated by the same method as described previously. As a result, the etch-pit density of Si-doped n-GaN layer 36 is 7×10⁶ (pits/cm²) and reduced by more than an order of magnitude compared to the etch-pit density in the case of the stack shown in FIG. 7.

Moreover, the present inventors changed the film thickness of undoped GaN layer 33 existing at the intermediate position of the stack shown in FIG. 8. In this series of experiments in which the film thickness was changed, it was found that this undoped GaN layer 33 influences the crystal defect density of Si-doped n-GaN layer 36. The result is shown in FIG. 9. FIG. 9 is a graph in which the film thickness of undoped GaN layer 33 is shown on the horizontal axis and in which the etch-pit density of the surface of Si-doped n-GaN layer 36 is shown on the vertical axis. In FIG. 9, the solid line represents the case of a known stack (stack of FIG. 7), and the dotted line represents the case of the stack of the present embodiment (stack of FIG. 8).

In FIG. 9, the known stack represented by the solid line will be described. The etch-pit density is reduced as the film thickness of undoped GaN layer 26 is increased, and shows the minimum value when the film thickness is approximately 8 □m. Factors responsible for the fact that the etch-pit density shows the minimum value when the film thickness is approximately 8 □m are uncertain. The lack of smoothness of the curve represented by the solid line is inferred to be caused by the fact that the alteration of the surface of the stack caused by the delicate change in growth conditions is also shown in the etch-pit density distribution.

On the other hand, in FIG. 9, the stack according to the present embodiment represented by the dotted line will be described. The etch-pit density shows the minimum value in the vicinity of 7 □m. It can be seen that the etch-pit density is reduced by more than an order of magnitude compared to the known stack. The smoothness of the curve represented by the dotted line is considered to be due to the fact that the alteration of the surface does not occur and that the etch-pit density distribution itself is reflected. Therefore, it was proved that the etch-pit density can be minimized by relatively thickly growing undoped GaN layer 33 to 4 to 10 □m and forming graded low-temperature deposited layer 34.

FIG. 10 shows a stack in which undoped GaN layer 45 is interposed between graded low-temperature deposited layer 44 and Si-doped n-GaN layer 46. Buffer layer 42, undoped GaN layer 43, graded low-temperature deposited layer 44, undoped GaN layer 45, and Si-doped n-GaN layer 46 is grown on sapphire substrate 41.

In the growth process for each layer, the supply of raw material and the lowering and raising of the substrate temperature are performed according to the growth process chart shown in FIG. 3. The growth of Si-doped n-GaN layer 46 is performed at a substrate temperature of 1100° C. by supplying SiH4 gas for Si doping.

When the surface of this stack was observed using an electron microscope or the like, the flatness of Si-doped n-GaN layer 46 was good, and roughness and the like indicating alteration were not observed.

The etch-pit density of the surface of Si-doped n-GaN layer 46 in this stack was evaluated by the same method as described previously. As a result, the effect of graded low-temperature deposited layer 44 and the effect of the film thickness of undoped GaN layer 43 thereunder were obtained as before. The etch-pit density of the surface of Si-doped n-GaN layer 46 is the same as that of the stack shown in FIG. 8, i.e., 7×10⁶ (pits/cm²). The etch-pit density is reduced by more than an order of magnitude compared to that of the known stack in which a graded low-temperature deposited layer is not interposed.

In the stack shown in FIG. 10, undoped GaN layer 45 is added to the stack shown in FIG. 8 between graded low-temperature deposited layer 44 and Si-doped n-GaN layer 46. However, the effect of this addition is not particularly observed.

Therefore, it can be seen that undoped GaN layer 45 does not necessarily need to be grown next to graded low-temperature deposited layer 44. It is considered that this is because Si-doped n-GaN layer 46 on graded low-temperature deposited layer 44 has a similar effect to that of undoped GaN layer 26 in the known stack. This means that undoped GaN layer 45 on graded low-temperature deposited layer 44 may be omitted in the actual manufacture of an LED structure.

As described previously, in the stack of the present embodiment, the etch-pit density of Si-doped n-GaN layer 36 can be reduced to 7×10⁶ (pits/cm²) by sequentially growing buffer layer 32, relatively thick undoped GaN layer 33, graded low-temperature deposited layer 34, and Si-doped n-GaN layer 36 on sapphire substrate 31.

In the manufacture of the stack of the present embodiment, undoped GaN layer 33, graded low-temperature deposited layer 34, and Si-doped n-GaN layer 36 on sapphire substrate 31 are continuously grown without growth interruption. Therefore, the alteration of the exposed surface, i.e., dropouts of N, Ga transport, and the like, does not occur particularly at high temperature and the exposed surface becomes flat. The surface of the low-temperature deposited layer formed thereon also becomes flat and the film thickness thereof is controlled. Since accidental dropouts of N, Ga transport, and the like are suppressed, the Si-doped n-GaN layer has high repeatability, and crystal defects are reduced.

A Si-doped n-GaN layer can be grown without providing an undoped GaN layer on a graded low-temperature deposited layer. In the actual fabrication of a group-III nitride semiconductor LED, the process can be shortened in accordance with the reduction in the number of times of growth interruption.

THIRD EMBODIMENT

Figure 11:
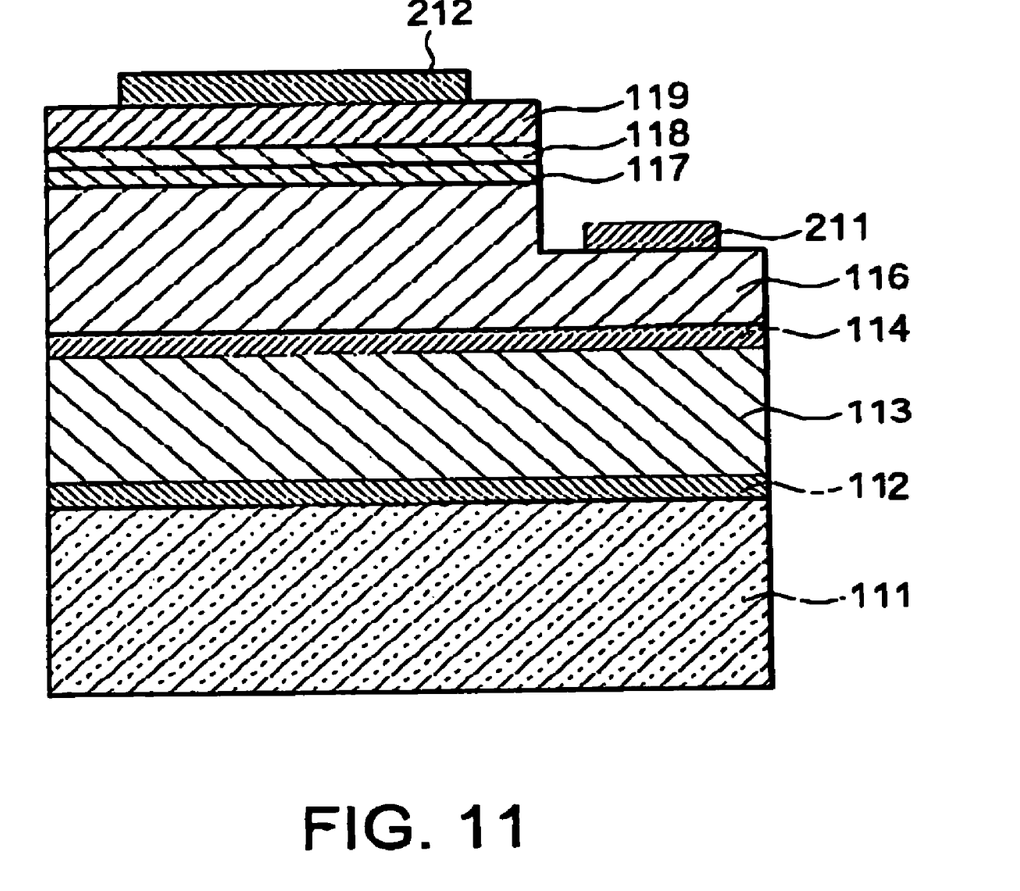
FIG. 11 is a structure diagram schematically showing a group-III nitride semiconductor LED according to a third embodiment of the present invention.

A third embodiment of the present invention will be described with reference to FIG. 11. The present embodiment is an example in which the stack as an underlying layer according to the second embodiment is applied to a group-III nitride semiconductor LED. FIG. 11 is a structure diagram schematically showing the group-III nitride semiconductor LED according to the third embodiment of the present invention.

As shown in FIG. 11, in the group-III nitride semiconductor LED of the present embodiment, buffer layer 112, undoped GaN layer 113, graded low-temperature deposited layer 114, n-GaN contact/cladding layer 116, InGaN MQW active layer 117, p-AlGaN cladding layer 118, and p-GaN contact layer 119 are stacked and formed in this order on sapphire substrate 111. N-side electrode 211 is formed on n-GaN contact/cladding layer 116. P-side electrode 212 is formed on p-GaN contact layer 119.

The group-III nitride semiconductor LED of the present embodiment is manufactured in one growth process using an MOCVD system. According to the growth conditions of FIGS. 3A and 3B, for example, sapphire substrate 111 is mounted in the MOCVD system, and buffer layer 112 of GaN is grown at a substrate temperature of 500° C. The inside of the MOCVD system is kept in the state of an ammonia atmosphere. Undoped GaN layer 113 is grown after the temperature of sapphire substrate 111 has reached 1100° C.

The temperature of sapphire substrate 111 is gradually and continuously lowered from 1100° C. toward 600° C. under control without growth interruption. On the other hand, the supply of TMA and the reduction of the supply amount of TMG are simultaneously started. The flow rate of TMG is gradually reduced at a constant rate, and the flow rate of TMA is gradually increased so as to match the reduction of TMG. Graded low-temperature deposited layer 114 in which the Al composition ratio of $Al_xGa_{1-x}N$ is gradually changed from 0 (1100° C.) to 1 (600° C.) is grown. After the temperature of sapphire substrate 111 has reached 600° C., the temperature is continuously raised toward 1100° C. under control again. At the same time, the flow rate of TMG is gradually increased at a constant rate, and the flow rate of TMA is gradually reduced so as to match the increase of TMG. Graded low-temperature deposited layer 114 in which the Al composition ratio of $Al_xGa_{1-x}N$ is gradually changed from 1 (600° C.) to 0 (1100° C.) is formed by gradually changing the Al composition ratio from a predetermined supply amount to 0 and the Ga composition ratio from 0 to a predetermined supply amount.

At the sapphire substrate temperature raised to 1100° C., the supply of a Si dopant is started without stopping the supply of TMG to grow Si-doped n-GaN layer 116. Thereafter, according to a normal stacking process of a group-III nitride semiconductor LED, InGaN MQW active layer 117, p-AlGaN cladding layer 118, and p-GaN contact layer 119 are stacked in this order.

Similar to the aforementioned embodiments, for the growth of a group-III nitride semiconductor, trimethylgallium (TMG) as Ga raw material, trimethylaluminum (TMA) as Al raw material, trimethylindium (TMI) as In raw material, and ammonia as N raw material are used. Moreover, biscyclopentadienylmagnesium (Cp2Mg) is used as p-type Mg doping raw material, and monosilane (SiH4) is used as n-type Si doping raw material.

The film thickness and composition of each layer will be described in detail. Buffer layer 112 formed on sapphire substrate 111 having a thickness of 150 μm has a thickness of 0.03 μm. To mention the other layers in order, undoped GaN layer 113 has a thickness of 5 μm, graded low-temperature deposited layer 114 in which the composition is changed to GaN, $Al_xGa_{1-x}N$ (x=0 to 1), AlN, $Al_yGa_{1-y}N$ (y=1 to 0), and GaN in this order has a thickness of 0.05 μm, n-GaN contact/cladding layer 116 has a thickness of 3 μm, InGaN MQW active layer 117 having a double well structure including an $In_{0.05}Ga_{0.95}N$ well layer of 0.003 μm and a GaN barrier layer of 0.006 μm has a thickness of 0.009 μm, $p-Al_{0.2}Ga_{0.8}N$ cladding layer 118 has a thickness of 0.05 μm, and p-GaN contact layer 119 formed at the uppermost portion has a thickness of 0.15 μm.

The resultant structure is taken out from the MOCVD system, one side portion of n-GaN contact/cladding layer 116 is removed from the surface thereof to the intermediate portion of the layer by etching. On n-GaN contact/cladding layer 116 in the etched and removed portion, n-side electrode 211 made of a Ti/Al layer is formed. On p-GaN contact layer 119, p-side electrode 212 made of a Ni/Au layer is formed. This p-side electrode 212 is thinned so as to almost completely transmit light from the active layer. Thus, the group-III nitride semiconductor LED is manufactured.

When a bias was applied to this manufactured LED, ultraviolet light having an emission wavelength of 380 nm was obtained through the p-side electrode. Light output at an operating current of 20 mA was 10 mW. On the other hand, for comparison, an LED having the known typical structure (structure having no undoped GaN layer and no graded low-temperature deposited layer) shown in FIG. 6 was manufactured, and light output under the same bias conditions was measured. As a result, the light output was 5 mW. It is considered that the effect of reducing crystal defects by the undoped GaN layer and the graded low-temperature deposited layer is to double the light output.

In the group-III nitride semiconductor LED of the present embodiment, constant LED characteristics were obtained with high repeatability even in different production lots. This means that the crystal defect density is small and that the evenness of the film thickness and the stability of the surface shape are in favorable states.

The present invention is not limited to the above first to third embodiments but can be variously modified without departing from the scope of the invention to be carried out.

For example, though sapphire has been used for a substrate in the aforementioned embodiments, a similar effect can be expected if spinel (MgAl2O4), Si, SiC, GaP, GaAs, or the like is used.

The composition of the graded low-temperature deposited layer has started with GaN, the ratio of Al has been gradually increased, and then, after the composition has become AlN, the ratio of Al has been gradually reduced in contrast to be changed until the composition has become GaN. However, even if the composition at the lowest formation temperature is an intermediate composition of $Al_xGa_{1-x}N$ ($0<x\leq1$), crystal defects can be expected to be reduced. Note that, in terms of temperature, it is important to perform growth while lowering the lowest growth temperature to 500 to 650° C.

In the aforementioned embodiments, the graded low-temperature deposited layer is formed by a method in which one of the flow rates of the group-III raw material gases is reduced and the other is increased in proportion to the film thickness. By reversing the direction of change at the lowest growth temperature, the composition has been changed almost linearly with the film thickness in each of two temperature ranges having the lowest growth temperature as a border. However, the composition can be changed exponentially, stepwise, or the like in each of the two temperature ranges having the lowest growth temperature as a border. If a change or the like obtained by combining these changes is adopted, a similar effect can be obtained.

Although only one layer of graded low-temperature deposited layer has been formed in the stack in the aforementioned embodiments, a plurality of graded low-temperature deposited layers may be formed. In a method of stacking the plurality of graded low-temperature deposited layers, a second graded low-temperature deposited layer may be continuously placed directly on a first graded low-temperature deposited layer. Alternatively, an n-type or undoped GaN layer grown at high temperature may be grown directly on the first graded low-temperature deposited layer, and the second graded low-temperature deposited layer may be placed thereon.

The buffer layer does not necessarily need to be formed. In this case, the first group-III nitride layer is formed on the principal surface of the single-crystal substrate.

If triethylgallium for Ga, triethylaluminum for Al, triethylindium for In, and hydrazine or the like for N are used as raw material for MOCVD, a similar effect can be expected.

Although an LED has been illustrated as a semiconductor device in the embodiments of the present invention, the effect thereof can be similarly obtained in the case of an LD.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A group-III nitride semiconductor stack, comprising:
a first group-III nitride layer;
a graded low-temperature deposited layer formed on the group-III nitride layer and made of nitride in which group-III element composition is continuously changed; and
a second group-III nitride layer formed on the graded low-temperature deposited layer,
wherein the graded low-temperature deposited layer is continuous with the first and second group-III nitride layers in terms of composition and represented by a compositional formula $Al_xGa_{1-x}N$ in which a composition ratio x increases from 0, becomes a maximum in the graded low-temperature deposited layer, decreases again, and becomes 0 at an uppermost portion of the graded low-temperature deposited layer along a direction of growth of films on the first group-III nitride layer.

2. The group-III nitride semiconductor stack according to claim 1, wherein the composition ratio x becomes 1 at a center portion of the graded low-temperature deposited layer.

3. The group-III nitride semiconductor stack according to claim 1, wherein the first group-III nitride layer is an undoped GaN layer, and the second group-III nitride layer is a Si-doped n-type GaN layer.

4. The group-III nitride semiconductor device according to claim 1, wherein the first group-III nitride layer is an undoped GaN layer and the second group-III nitride layer is a Si-doped n-type GaN layer.

5. The group-III nitride semiconductor device according to claim 1, wherein the first group-III nitride layer and the second group-III nitride layer are undoped GaN layers.

6. A group-III nitride semiconductor stack, comprising:
a first group-III nitride layer;
a graded low-temperature deposited layer formed on the group-III nitride layer and made of nitride in which group-III element composition is continuously changed; and
a second group-III nitride layer formed on the graded low-temperature deposited layer,
wherein the number of the graded low-temperature deposited layers formed is more than 1 and the plurality of graded low-temperature deposited layers are first and second graded low-temperature deposited layers, the second graded low-temperature deposited layer being continuously placed directly on the first graded low-temperature deposited layer.

7. The group-III nitride semiconductor device according to claim 6, wherein the first group-III nitride layer is an undoped GaN layer and the second group-III nitride layer is a Si-doped n-type GaN layer.

8. The group-III nitride semiconductor device according to claim 6, wherein the first group-III nitride layer and the second group-III nitride layer are undoped GaN layers.

9. A group-III nitride semiconductor stack, comprising:
a first group-III nitride layer;
a graded low-temperature deposited layer formed on the group-III nitride layer and made of nitride in which group-III element composition is continuously changed; and
a second group-III nitride layer formed on the graded low-temperature deposited layer,
wherein the number of the graded low-temperature deposited layers formed is more than 1 and the plurality of graded low-temperature deposited layers are first and second graded low-temperature deposited layers, the second graded low-temperature deposited layer being placed on a GaN layer grown at high temperature directly on the first graded low-temperature deposited layer, the GaN layer being any one of an n-type GaN layer and an undoped GaN layer.

10. The group-III nitride semiconductor device according to claim 9, wherein the first group-III nitride layer is an undoped GaN layer and the second group-III nitride layer is a Si-doped n-type GaN layer.

11. The group-III nitride semiconductor device according to claim 9, wherein the first group-III nitride layer and the second group-III nitride layer are undoped GaN layers.

12. A group-III nitride semiconductor device, comprising:
an undoped group-III nitride layer;
a graded low-temperature deposited layer which is formed on the undoped group-III nitride layer and in which group-III element composition is continuously changed;
an n-type group-III nitride cladding layer formed on the graded low-temperature deposited layer;
a group-III nitride MQW active layer formed on the n-type group-III nitride cladding layer;
a p-type group-III nitride cladding layer formed on the group-III nitride MQW active layer; and
a p-type group-III nitride contact layer formed on the p-type group-III nitride cladding layer,
wherein the undoped group-III nitride layer is a GaN layer, the graded low-temperature deposited layer is $Al_xGa_{1-x}N$ in which a composition ratio x changes between 0 and 1, and the n-type group-III nitride cladding layer is a Si-doped GaN layer.

13. The group-III nitride semiconductor device according to claim 12, wherein in the compositional formula AlxGa1−xN, the composition ratio x increases from 0, becomes a maximum at a center portion of the graded low-temperature deposited layer, decreases again, and becomes 0 at an uppermost portion of the graded low-temperature deposited layer along a direction of growth of films on the first group-III nitride layer.

14. The group-III nitride semiconductor device according to claim 13, wherein the composition ratio x becomes 1 at the center portion of the graded low-temperature deposited layer.

15. The group-III nitride semiconductor device according to claim 12, wherein the n-type group-III nitride cladding layer functions as a contact layer.

16. A group-III nitride semiconductor device, comprising:
an undoned group-III nitride layer;
a graded low-temperature deposited layer which is formed on the undoped group-III nitride layer and in which group-III element composition is continuously changed;
an n-type group-III nitride cladding layer formed on the graded low-temperature deposited layer;
a group-III nitride MQW active layer formed on the n-type group III nitride cladding layer;
a p-type group-III nitride cladding layer formed on the group-III nitride MQW active layer; and
a p-type group-III nitride contact layer formed on the p-type group-III nitride cladding layer,
wherein the number of the graded low-temperature deposited layers formed is more than 1.

17. The group-III nitride semiconductor device according to claim 16, wherein the plurality of graded low-temperature deposited layers are first and second graded low-temperature deposited layers, the second graded low-temperature deposited layer being continuously placed directly on the first graded low-temperature deposited layer.

18. The group-III nitride semiconductor device according to claim 16, wherein the plurality of graded low-temperature deposited layers are first and second graded low-temperature deposited layers, the second graded low-temperature deposited layer being placed on a GaN layer grown at high temperature directly on the first graded low-temperature deposited layer, the GaN layer being any one of an n-type GaN layer and an undoped GaN layer.

19. The group-III nitride semiconductor device according to claim 16, wherein the n-type group-III nitride cladding layer functions as a contact layer.

* * * * *